United States Patent
Ban

(10) Patent No.: US 10,460,991 B2
(45) Date of Patent: Oct. 29, 2019

(54) RESIN PACKAGE SUBSTRATE PROCESSING METHOD

(71) Applicant: DISCO CORPORATION, Tokyo (JP)

(72) Inventor: Yuri Ban, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/847,224

(22) Filed: Dec. 19, 2017

(65) Prior Publication Data

US 2018/0197776 A1    Jul. 12, 2018

(30) Foreign Application Priority Data

Jan. 6, 2017  (JP) .................................. 2017-001252

(51) Int. Cl.

| H01L 21/78 | (2006.01) |
|---|---|
| H01L 21/683 | (2006.01) |
| H01L 21/02 | (2006.01) |
| H01L 23/31 | (2006.01) |

(Continued)

(52) U.S. Cl.
CPC ........ *H01L 21/78* (2013.01); *H01L 21/02076* (2013.01); *H01L 21/561* (2013.01); *H01L 21/565* (2013.01); *H01L 21/568* (2013.01); *H01L 21/67051* (2013.01); *H01L 21/67092* (2013.01); *H01L 21/67132* (2013.01); *H01L 21/67144* (2013.01); *H01L 21/6836* (2013.01); *H01L 23/3121* (2013.01); *H01L 23/3135* (2013.01); *H01L 23/3114* (2013.01);

(Continued)

(58) Field of Classification Search
CPC .............. H01L 21/565; H01L 23/3135; H01L 23/3121; H01L 21/568; H01L 21/6836; H01L 21/02076; H01L 21/561
See application file for complete search history.

(56) References Cited

U.S. PATENT DOCUMENTS

| 2006/0128065 A1* | 6/2006 | Inada ................ H01L 21/67132 |
|---|---|---|
| | | 438/118 |
| 2007/0134890 A1* | 6/2007 | Watanabe ......... H01L 21/67092 |
| | | 438/462 |

(Continued)

FOREIGN PATENT DOCUMENTS

JP    2002-100709    4/2002

*Primary Examiner* — Bilkis Jahan
*Assistant Examiner* — Victor V Barzykin
(74) *Attorney, Agent, or Firm* — Greer, Burns & Crain, Ltd.

(57) ABSTRACT

Disclosed herein is a resin package substrate processing method for processing a resin package substrate including a mold resin in which a filler is mixed. The resin package substrate processing method includes a fixing step of fixing the resin package substrate through an adhesive tape to an annular frame, a dividing step of applying a laser beam having an absorption wavelength to the mold resin of the resin package substrate, to the mold resin to thereby form a plurality of division grooves dividing the resin package substrate into a plurality of package device chips, an inter-chip distance increasing step of expanding the adhesive tape to thereby increase the distance between any adjacent ones of the plural package device chips of the resin package substrate, and a cleaning step of supplying a cleaning liquid to the resin package substrate to thereby remove the filler caught between the adjacent package device chips.

14 Claims, 14 Drawing Sheets

(51) Int. Cl.
*H01L 21/56* (2006.01)
*H01L 21/67* (2006.01)

(52) U.S. Cl.
CPC ............... *H01L 2221/68327* (2013.01); *H01L 2221/68331* (2013.01); *H01L 2221/68336* (2013.01)

(56) References Cited

U.S. PATENT DOCUMENTS

| | | | |
|---|---|---|---|
| 2008/0090381 A1* | 4/2008 | Furuta | B23K 26/16 438/463 |
| 2009/0194154 A1* | 8/2009 | Takahashi | H01L 27/14621 136/255 |
| 2011/0081768 A1* | 4/2011 | Nakamura | H01L 21/67092 438/462 |
| 2016/0012961 A1* | 1/2016 | Suzuki | H01F 27/29 336/192 |
| 2017/0140972 A1* | 5/2017 | Kimura | H01L 21/6836 |

* cited by examiner

RESIN PACKAGE SUBSTRATE PROCESSING METHOD

BACKGROUND OF THE INVENTION

Field of the Invention

The present invention relates to a resin package substrate processing method.

Description of the Related Art

Cutting by a cutting blade or ablation by the application of a laser beam is known as a processing method for dividing a semiconductor wafer into individual device chips. In general, each device chip is fixed to a mother substrate or the like, next bonded through wires or the like to the mother substrate, and next packaged with a mold resin. However, when the device chip is operated for a long period of time, there is a possibility that fine cracks on the side surface of the device chip may extend to cause the breakage of the device chip. To suppress the breakage of the device chip, there has been developed a packaging method of covering the side surface of the device chip with a mold resin to block the influence of any external environmental factor on the device chip (see Japanese Patent Laid-open No. 2002-100709, for example).

In this packaging method described in Japanese Patent Laid-open No. 2002-100709, a groove is first formed along each division line (street) on the front side of a wafer having devices. Thereafter, the front side of the wafer is covered with a mold resin so that each groove is filled with the mold resin. Thereafter, the wafer is thinned until the mold resin filling each groove is exposed to the back side of the wafer, thereby dividing the devices of the wafer from each other. Finally, the mold resin filling each groove is divided from the front side of the wafer to thereby obtain individual device chips. In the above-mentioned packaging method, it has been developed to use ablation by the application of a laser beam rather than cutting by a cutting blade, so as to divide the wafer into the device chips. Such ablation is useful because the area to be divided between the adjacent device chips can be made very narrow, so that the width of each division line can be designed to be very small. As a result, the number of device chips per wafer can be increased.

SUMMARY OF THE INVENTION

The mold resin used in the packaging method described in Japanese Patent Laid-open No. 2002-100709 contains a filler (e.g., silica particles) for adjusting the coefficient of linear expansion of the mold resin to thereby suppress the warpage of the mold resin. The absorption wavelength of a laser beam to the filler is different from that to the mold resin, so that when ablation is performed to the mold resin, the filler is not processed, but left in each division groove dividing the mold resin. In particular, when the diameter of the filler is larger than the width of each division groove, the filler is caught in each division groove and it cannot be removed in a cleaning step. As a result, in the subsequent step, there is a possibility that the remaining filler may fall from the side surface of each device chip, causing a defect on other products.

It is therefore an object of the present invention to provide a resin package substrate processing method which can prevent falling of the filler in the subsequent step.

In accordance with an aspect of the present invention, there is provided a resin package substrate processing method for processing a resin package substrate including a mold resin in which a filler is mixed, the resin package substrate processing method including a fixing step of fixing the resin package substrate through an expandable adhesive tape to an annular frame having an inside opening in the condition where the resin package substrate is positioned in the inside opening of the annular frame; a dividing step of applying a laser beam having an absorption wavelength to the mold resin of the resin package substrate, to the mold resin after performing the fixing step, thereby forming a plurality of division grooves and dividing the resin package substrate into a plurality of chips; an interchip distance increasing step of expanding the adhesive tape after performing the dividing step, thereby increasing the distance between any adjacent ones of the chips to a distance greater than or equal to the diameter of the filler in the condition where the filler is caught between the adjacent chips; and a cleaning step of supplying a cleaning liquid to the resin package substrate after performing the interchip distance increasing step, thereby removing the filler caught between the adjacent chips; whereby when each chip is picked up from the adhesive tape, falling of the filler from each chip is prevented.

Preferably, the interchip distance increasing step includes the step of relatively moving the annular frame and the resin package substrate attached to the adhesive tape away from each other in a direction perpendicular to a planar direction of the adhesive tape, thereby increasing the distance between the adjacent chips; the resin package substrate processing method further including a slack removing step of removing a slack of the adhesive tape due to expansion of the adhesive tape, between the interchip distance increasing step and the cleaning step.

Preferably, the resin package substrate includes a mold substrate and an interposer substrate stacked on the mold substrate, the mold substrate having a plurality of device chips covered with the mold resin; the resin package substrate processing method further including a liquid resin applying step of applying a water-soluble liquid resin to the exposed upper surface of the interposer substrate stacked on the mold substrate, before performing the dividing step; the dividing step including the step of applying a first laser beam having an absorption wavelength to the interposer substrate, to the upper surface of the interposer substrate to thereby form a plurality of first division grooves dividing the interposer substrate, and next applying a second laser beam having an absorption wavelength to the mold resin of the mold substrate, through the first division grooves to the mold resin to thereby form a plurality of second division grooves dividing the mold resin of the mold substrate so that the second division grooves are each continuous to the first division grooves; the cleaning step including the step of removing the liquid resin from the interposer substrate.

In the resin package substrate processing method according to the present invention, the division grooves are formed by the dividing step and the width of each division groove is increased by the interchip distance increasing step. In this condition, the resin package substrate divided into the individual chips is cleaned by the cleaning step. Accordingly, the filler caught in each division groove, i.e., between the adjacent chips can be reliably removed by the cleaning liquid in the cleaning step. As a result, falling of the filler in the subsequent step can be prevented.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

First Preferred Embodiment

Figure 1:
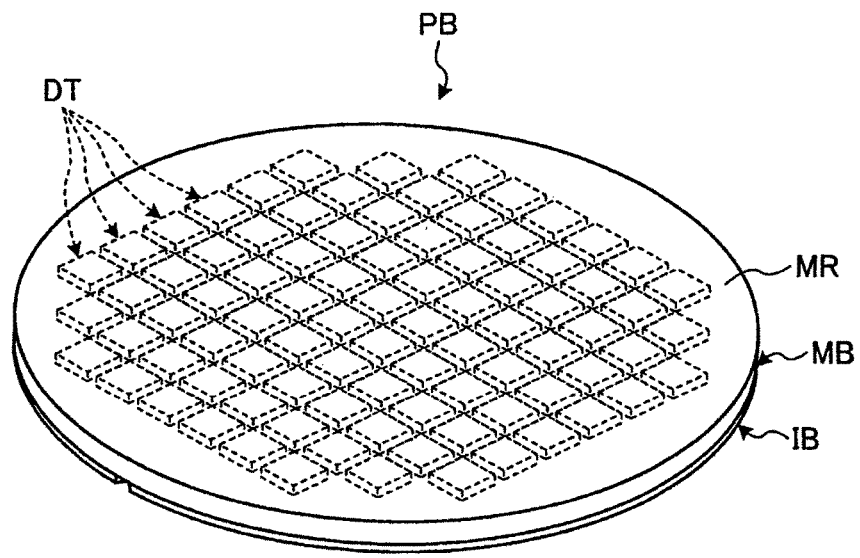
FIG. 1 is a perspective view depicting the back side of a resin package substrate as a workpiece to be processed by a resin package substrate processing method according to a first preferred embodiment of the present invention.
Figure 2:
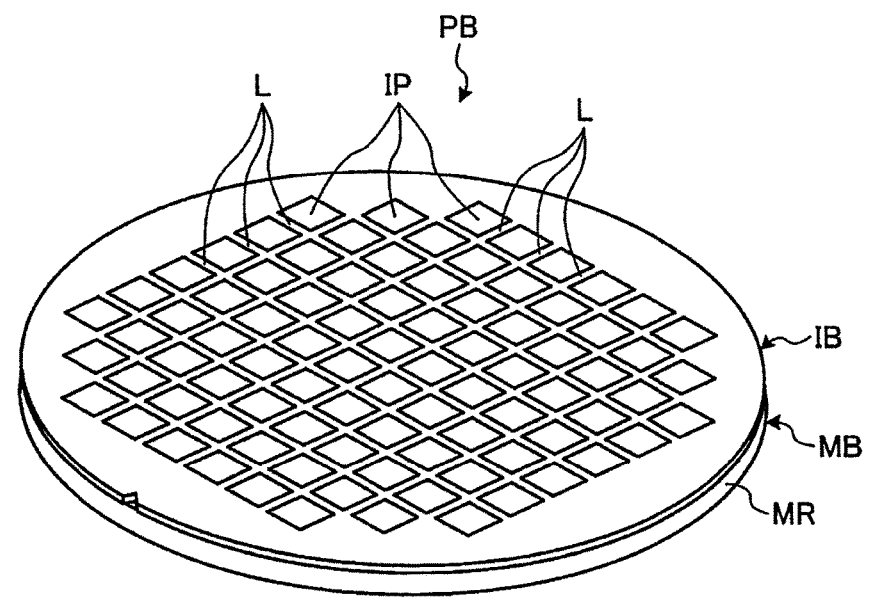
FIG. 2 is a perspective view depicting the front side of the resin package substrate depicted in FIG. 1.
Figure 3:
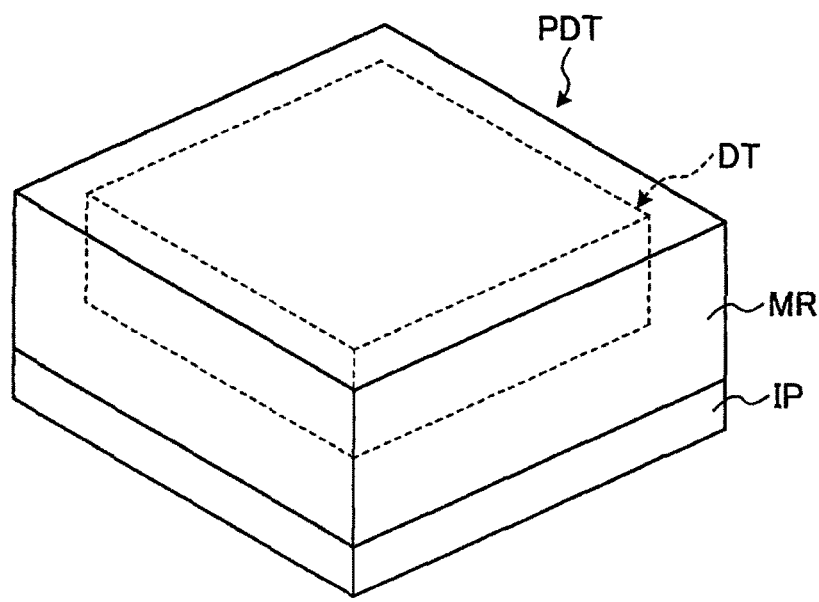
FIG. 3 is a perspective view depicting a package device chip obtained by dividing the resin package substrate depicted in FIG. 1.
Figure 4:
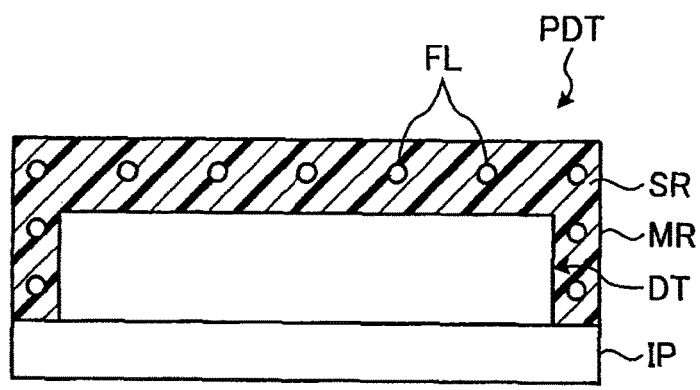
FIG. 4 is a sectional view of the package device chip depicted in FIG. 3.

A resin package substrate processing method according to a first preferred embodiment will now be described with reference to the drawings. FIG. 1 is a perspective view depicting the back side of a resin package substrate PB as a workpiece to be processed by the resin package substrate processing method according to the first preferred embodiment. FIG. 2 is a perspective view depicting the front side of the resin package substrate PB depicted in FIG. 1. FIG. 3 is a perspective view depicting a package device chip PDT obtained by dividing the resin package substrate PB depicted in FIG. 1. FIG. 4 is a sectional view of the package device chip PDT; depicted in FIG. 3.

The resin package substrate processing method according to the first preferred embodiment is a processing method for the resin package substrate PB depicted in FIGS. 1 and 2. That is, this processing method is a method for dividing the resin package substrate PB into a plurality of package device chips PDT as chips, one of which is depicted in FIG. 3.

As depicted in FIG. 1, the resin package substrate PB includes a mold substrate MB and an interposer substrate IB stacked on the mold substrate MB. The mold substrate MB includes a mold resin MR covering a plurality of device chips DT.

Each device chip DT is an electronic component configured by stacking a plurality of substrates, such as IC (integrated circuit), LSI (large-scale integration), and memory. The plural device chips DT are arranged along two straight directions intersecting each other (e.g., intersecting at right angles in this preferred embodiment) so as to be spaced from each other. These device chips DT are arranged at equal intervals. As depicted in FIG. 4, the mold resin MR is composed of a synthetic resin SR and a filler FL mixed in the synthetic resin SR. The filler FL functions to adjust the coefficient of linear expansion of the mold resin MR, thereby suppressing deformation of the mold resin MR, such as warpage. For example, the filler FL is formed from fine particles of $SiO_2$ (silica) or SiC (silicon carbide).

The interposer substrate IB is a disk-shaped semiconductor wafer formed from a silicon substrate in this preferred embodiment. As depicted in FIG. 2, a plurality of crossing division lines L (e.g., intersecting at right angles in this preferred embodiment) are set on the interposer substrate IB to define a plurality of separate regions where a plurality of wiring patterns IP are each formed. These plural wiring patterns IP correspond to the plural device chips DT. In this preferred embodiment, one or more wiring patterns IP correspond to one device chip DT. As depicted in FIGS. 3 and 4, the wiring pattern IP and the device chip DT corresponding to each other are stacked and electrically connected. Further, the space between any adjacent ones of the device chips DT is filled with the mold resin MR, and the mold resin MR present in each space between the adjacent device chips DT is stacked on the division lines L of the interposer substrate IB. Each wiring pattern IP is used to connect the corresponding device chip DT to a printed board or the like.

The resin package substrate PB is divided along the division lines L of the interposer substrate IB to obtain the individual package device chips PDT. As depicted in FIG. 4, each package device chip PDT is composed of the wiring pattern IP, the device chip DT stacked on the wiring pattern IP, and the mold resin MR covering the device chip DT.

Figure 5:
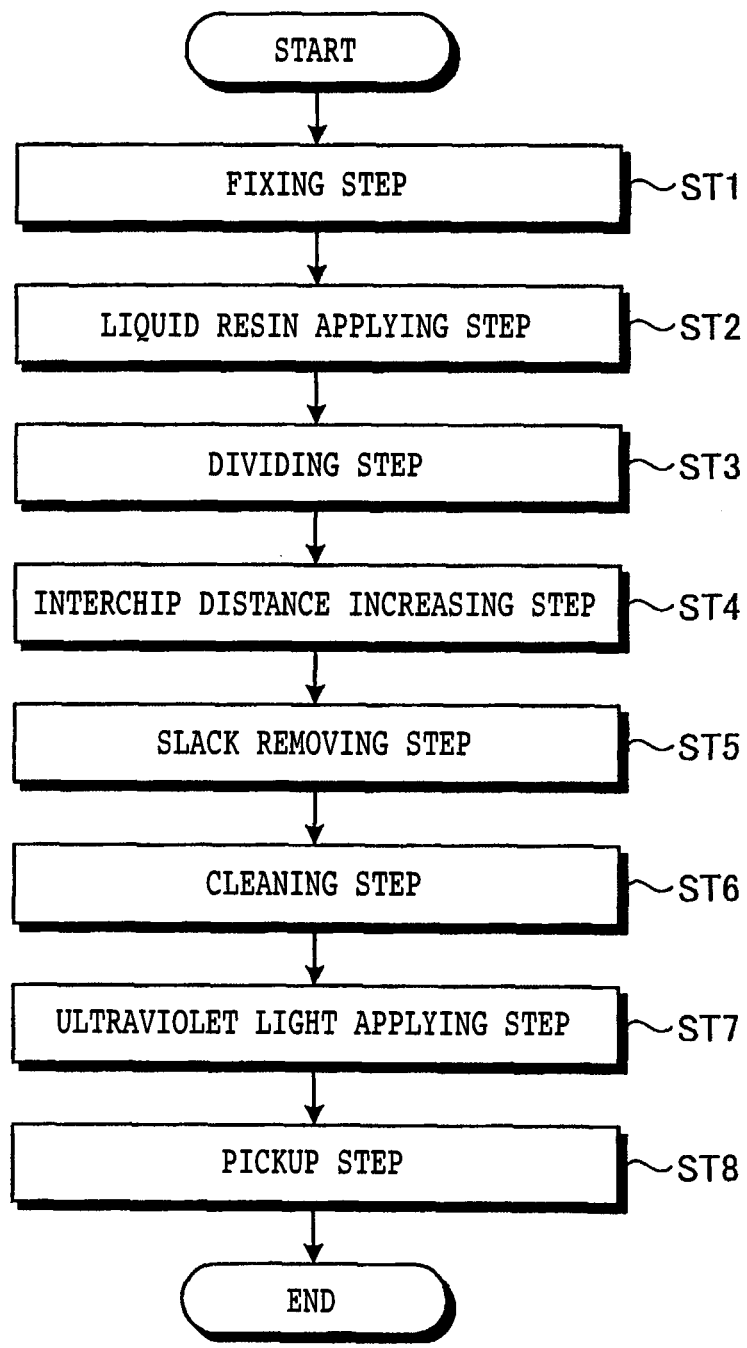
FIG. 5 is a flowchart depicting the flow of the resin package substrate processing method according to the first preferred embodiment.

There will now be described the resin package substrate processing method according to the first preferred embodiment with reference to the drawings. FIG. 5 is a flowchart depicting the flow of the resin package substrate processing method according to the first preferred embodiment.

As depicted in FIG. 5, the resin package substrate processing method (which will be hereinafter referred to simply as "processing method") according to the first preferred embodiment includes a fixing step ST1, liquid resin applying step ST2, dividing step ST3, interchip distance increasing step ST4, slack removing step ST5, cleaning step ST6, ultraviolet light applying step ST7, and pickup step ST8.

(Fixing Step ST1)

Figure 6:
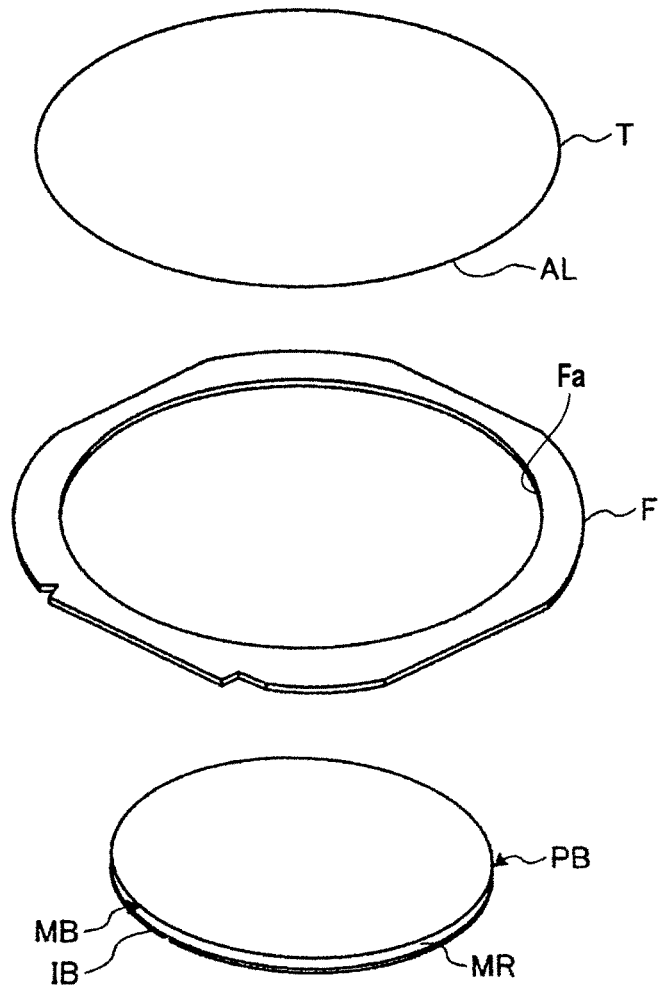
FIG. 6 is a perspective view depicting a fixing step in the resin package substrate processing method depicted in FIG. 5, in which the resin package substrate, an annular frame, and an adhesive tape are vertically arranged at intervals in this order from the lower side.
Figure 7:
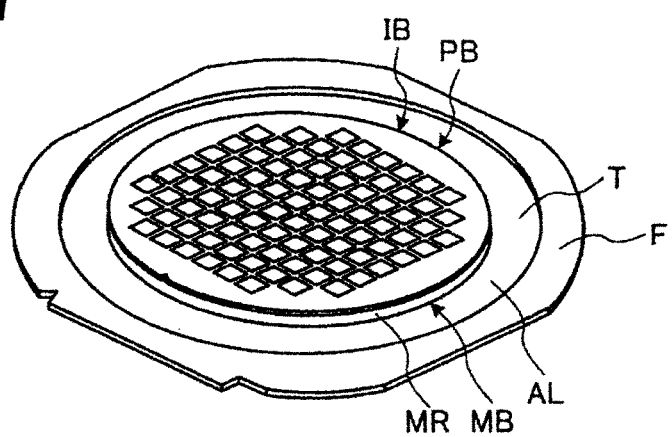
FIG. 7 is a perspective view depicting the resin package substrate fixed through the adhesive tape to the annular frame as obtained by the fixing step in the resin package substrate processing method depicted in FIG. 5.

FIG. 6 is a perspective view depicting the fixing step ST1 in the processing method depicted in FIG. 5, in which the resin package substrate PB, an annular frame F, and an adhesive tape T are vertically arranged at intervals in this order from the lower side. FIG. 7 is a perspective view depicting the resin package substrate PB fixed through the adhesive tape T to the annular frame F as obtained by the fixing step ST1.

In the processing method, the fixing step ST1 is first performed. The fixing step ST1 is the step of fixing the resin package substrate PB through the adhesive tape T to the annular frame F having an inside opening Fa, in which the resin package substrate PB is positioned in the inside opening Fa of the annular frame F. As depicted in FIG. 6, the resin package substrate PB, the annular frame F, and the adhesive tape T are arranged in this order from the lower side, in which the mold substrate MB of the resin package substrate PB is oriented upward. The inside opening Fa of the annular frame F is circular, and the annular frame F has a ringlike shape.

The adhesive tape T is composed of a base sheet and an adhesive layer AL formed on one side of the base sheet. The base sheet has a property such that it is expandable (stretchable) at ordinary temperatures and contacts when heated to a predetermined temperature (e.g., 70° C.) or more. For example, the base sheet is a synthetic resin sheet capable of transmitting ultraviolet light, such as polyvinyl chloride, polypropylene, and polyolefin sheet. The adhesive layer AL is formed of an adhesive material such as an ultraviolet curing resin curable by the application of ultraviolet light. That is, the adhesive tape T is an ultraviolet curing type adhesive tape in this preferred embodiment.

In performing the fixing step ST1, the adhesive layer AL of the adhesive tape T is opposed to the mold resin MR of the resin package substrate PB and the annular frame F as depicted in FIG. 6. In this condition, a peripheral portion of the adhesive layer AL of the adhesive tape T is attached to the annular frame F, and a central portion of the adhesive layer AL of the adhesive tape T is attached to the mold resin MR of the resin package substrate PB in the condition where the resin package substrate PB is positioned in the inside opening Fa of the annular frame F as depicted in FIG. 7. Thus, the resin package substrate PB is fixed through the adhesive tape T to the annular frame F in the condition where the interposer substrate IB of the resin package substrate PB is oriented upward.

(Liquid Resin Applying Step ST2)

Figure 8:
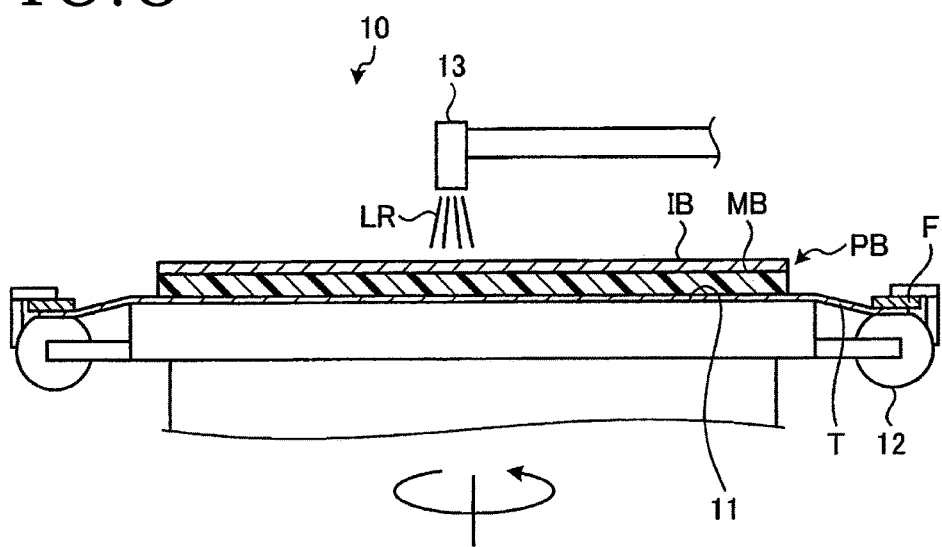
FIG. 8 is a sectional side view depicting a liquid resin applying step in the resin package substrate processing method depicted in FIG. 5.
Figure 9:
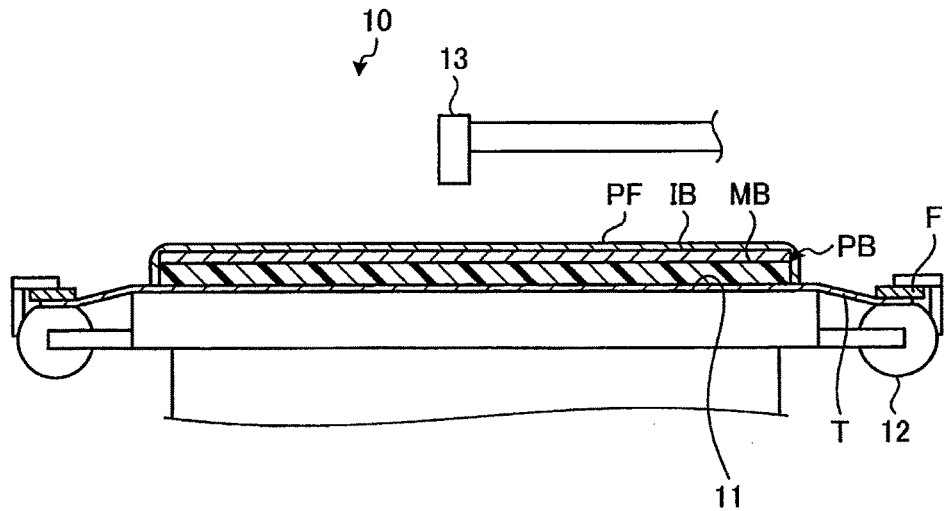
FIG. 9 is a sectional side view depicting the resin package substrate processed by the liquid resin applying step.

FIG. 8 is a sectional side view depicting the liquid resin applying step ST2 in the processing method depicted in FIG. 5. FIG. 9 is a sectional side view depicting the resin package substrate PB processed by the liquid resin applying step ST2.

The liquid resin applying step ST2 is the step of applying a water-soluble liquid resin LR (see FIG. 8) to the exposed upper surface of the interposer substrate IB stacked on the mold substrate MB of the resin package substrate PB, prior to performing the dividing step ST3. As depicted in FIG. 8, the liquid resin applying step ST2 is performed by using a coating apparatus 10 having a chuck table 11, clamps 12, and a nozzle 13. The resin package substrate PB is first held through the adhesive tape T on the chuck table 11 under suction in the condition where the interposer substrate IB is exposed upward. Thereafter, the annular frame F is fixed by the clamps 12 provided on the outer circumference of the chuck table 11.

Thereafter, the nozzle 13 is positioned above the center of the upper surface of the interposer substrate IB of the resin package substrate PB held on the chuck table 11, and the liquid resin LR is applied from the nozzle 13 to the upper surface of the interposer substrate IB as rotating the chuck table 11 about its axis extending in a vertical direction as depicted in FIG. 8. Accordingly, the liquid resin LR applied is spread over the entire upper surface of the interposer substrate IB. Thereafter, as depicted in FIG. 9, the application of the liquid resin LR from the nozzle 13 is stopped and the liquid resin LR on the interposer substrate IB is cured with the elapse of time, thereby forming a protective film PF on the upper surface of the interposer substrate IB. The protective film PF functions to suppress the deposition of debris to the wiring patterns IP in the dividing step ST3. The liquid resin LR is a water-soluble resin such as polyvinyl alcohol (PVA) and polyvinyl pyrrolidone (PVP).

(Dividing Step ST3)

Figure 10:
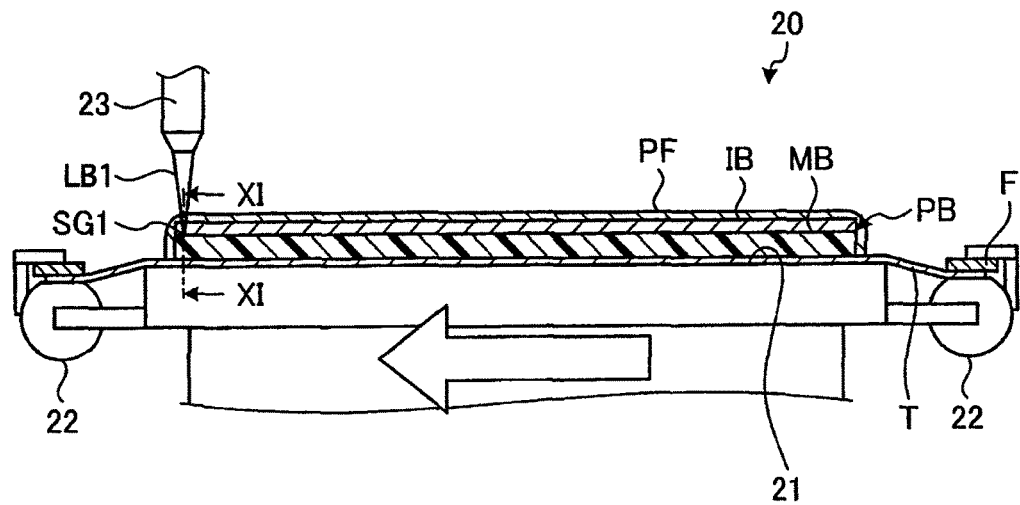
FIG. 10 is a sectional side view depicting a first substep of a dividing step in the resin package substrate processing method depicted in FIG. 5, in which a first division groove is formed.
Figure 11:
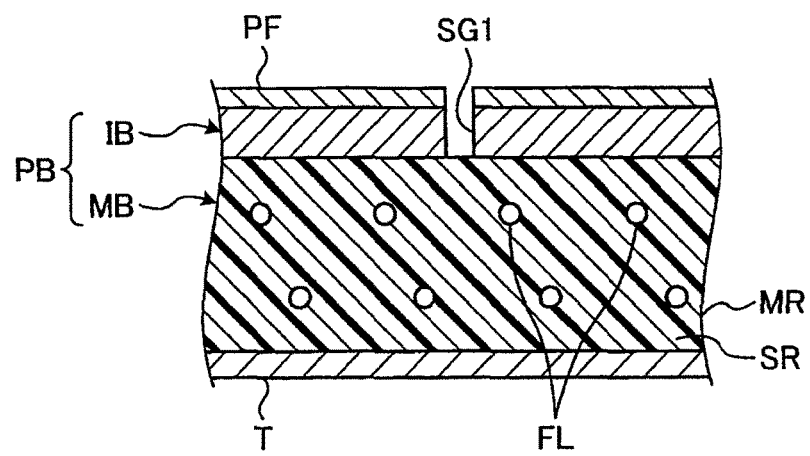
FIG. 11 is an enlarged cross section taken along the line XI-XI in FIG. 10.
Figure 12:
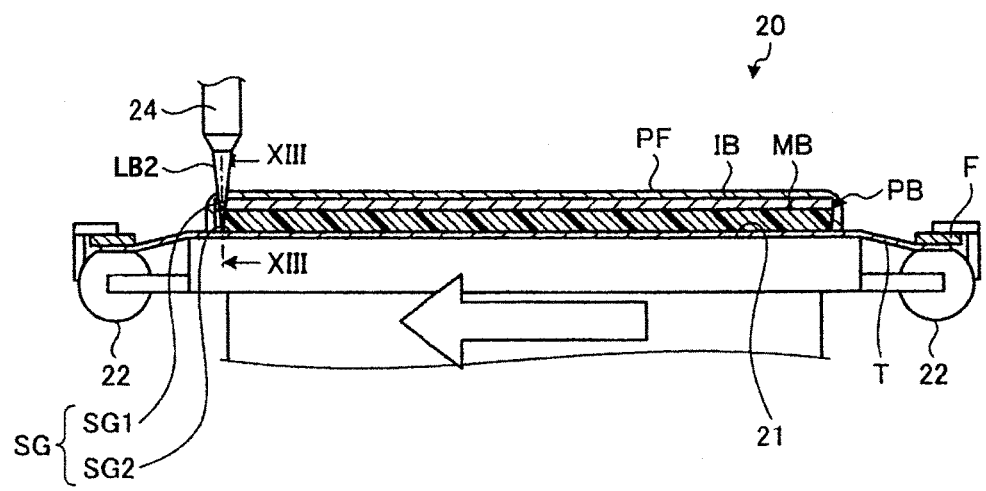
FIG. 12 is a sectional view depicting a second substep of the dividing step, in which a second division groove is formed.
Figure 13:
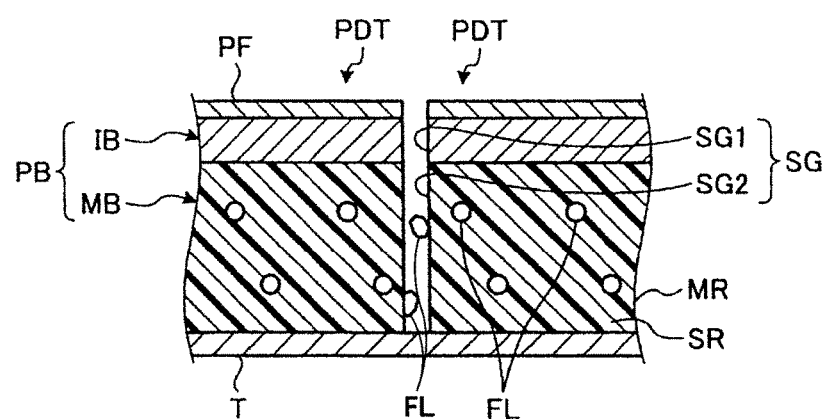
FIG. 13 is an enlarged cross section taken along the line XIII-XIII in FIG. 12.

FIG. 10 is a sectional side view depicting a first substep of the dividing step ST3 in the processing method depicted in FIG. 5, in which a first division groove SG1 is formed. FIG. 11 is an enlarged cross section taken along the line XI-XI in FIG. 10. FIG. 12 is a sectional side view depicting a second substep of the dividing step ST3 in the processing method depicted in FIG. 5, in which a second division groove SG2 is formed. FIG. 13 is an enlarged cross section taken along the line XIII-XIII in FIG. 12.

The dividing step ST3 is the step of applying a laser beam LB2 (see FIG. 12) having an absorption wavelength to the mold resin MR of the resin package substrate PB, to the mold resin MR after performing the liquid resin applying step ST2, i.e., after performing the fixing step ST1, thereby forming a plurality of division grooves SG (see FIG. 13) dividing the resin package substrate PB into a plurality of package device chips PDT.

As depicted in FIG. 10, the dividing step ST3 is performed by using a laser processing apparatus 20 having a chuck table 21, clamps 22, and first laser beam applying means 23. The resin package substrate PB is first held through the adhesive tape T on the chuck table 21 under suction in the condition where the protective film PF formed on the interposer substrate IB is exposed upward. Thereafter, the annular frame F is fixed by the clamps 22 provided on the outer circumference of the chuck table 21. Thereafter, the first laser beam applying means 23 for applying a laser beam LB1 having an absorption wavelength to the interposer substrate IB is opposed to a target one of the division lines L of the interposer substrate IB. Thereafter, as depicted in FIG. 10, the laser beam LB1 is applied from the first laser beam applying means 23 to the target division line L of the interposer substrate IB as moving the chuck table 21 in a horizontal direction parallel to the target division line L.

Thereafter, the laser beam LB1 is similarly applied to all of the other division lines L of the interposer substrate IB to thereby form a first division groove SG1 dividing the interposer substrate IB along each division line L as depicted in FIG. 11. For example, the wavelength of the laser beam LB1 to be applied from the first laser beam applying means 23 is set to 355 nm or 532 nm.

After forming the first division groove SG1 along each division line L, the first laser beam applying means 23 is retracted and second laser beam applying means 24 included in the laser processing apparatus 20 is opposed to a target one of the first division grooves SG1. The second laser beam applying means 24 functions to apply a laser beam LB2 having an absorption wavelength to the mold resin MR of the mold substrate MB. Thereafter, as depicted in FIG. 12, the laser beam LB2 is applied from the second laser beam applying means 24 through the target first division groove SG1 to the mold resin MR of the mold substrate MB as moving the chuck table 21 in a horizontal direction parallel to the target first division groove SG1, i.e., the corresponding division line L.

Thereafter, the laser beam LB2 is similarly applied through all of the other first division grooves SG1 to the mold resin MR of the mold substrate MB to thereby form a second division groove SG2 dividing the mold resin MR along each first division groove SG1, in which each second division groove SG2 is continuous to the corresponding first division groove SG1 as depicted in FIG. 13. Thus, the first division groove SG1 and the second division groove SG2 corresponding to each other constitute a division groove SG dividing the resin package substrate PB along each division line L. For example, the wavelength of the laser beam LB2 to be applied from the second laser beam applying means 24 is set to 355 nm or 532 nm, in which this wavelength is a transmission wavelength to the filler FL. Accordingly, as depicted in FIG. 13, the filler FL is caught in each division groove SG, i.e., between any adjacent ones of the package device chips PDT. The filler FL caught between the adjacent package device chips PDT is partially embedded in the mold resin MR of each package device chip PDT.

In the processing method according to the first embodiment, the interchip distance increasing step ST4, the slack removing step ST5, the cleaning step ST6, and the ultraviolet light applying step ST7 in the processing method are performed by using a workpiece dividing apparatus described in Japanese Patent Laid-open No. 2010-206136. However, any other apparatuses may be used to perform the interchip distance increasing step ST4, the slack removing step ST5, the cleaning step ST6, and the ultraviolet light applying step ST7. The workpiece dividing apparatus described above includes an expanding and heating unit 40 depicted in FIG. 14, a cleaning unit 50 depicted in FIG. 19, an ultraviolet light applying unit (not depicted), and a transfer unit (not depicted) for transferring the resin package substrate PB to and from the expanding and heating unit 40.

(Interchip Distance Increasing Step ST4)

Figure 14:
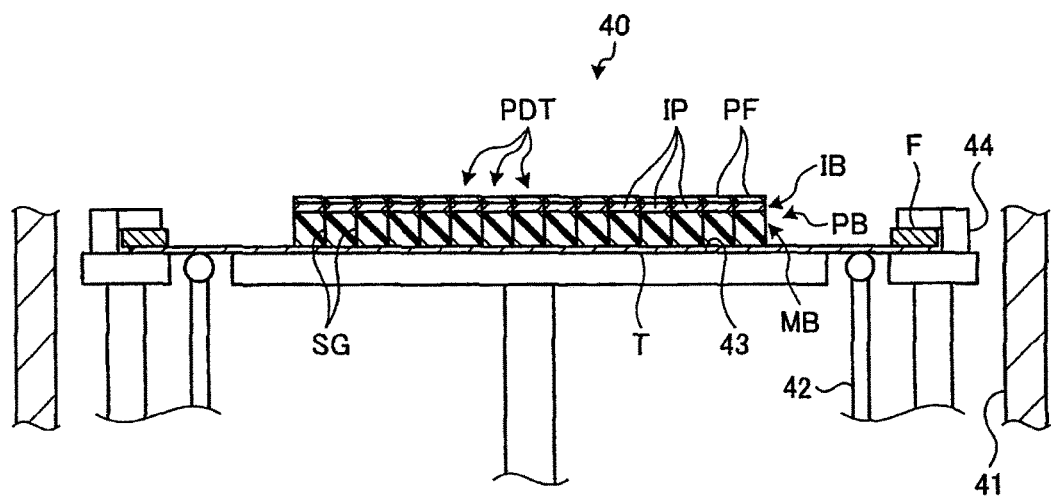
FIG. 14 is a sectional side view depicting a first substep of an intership distance increasing step in the resin package substrate processing method depicted in FIG. 5, in which the annular frame and the resin package substrate divided into package device chips are held in a standby position.
Figure 15:
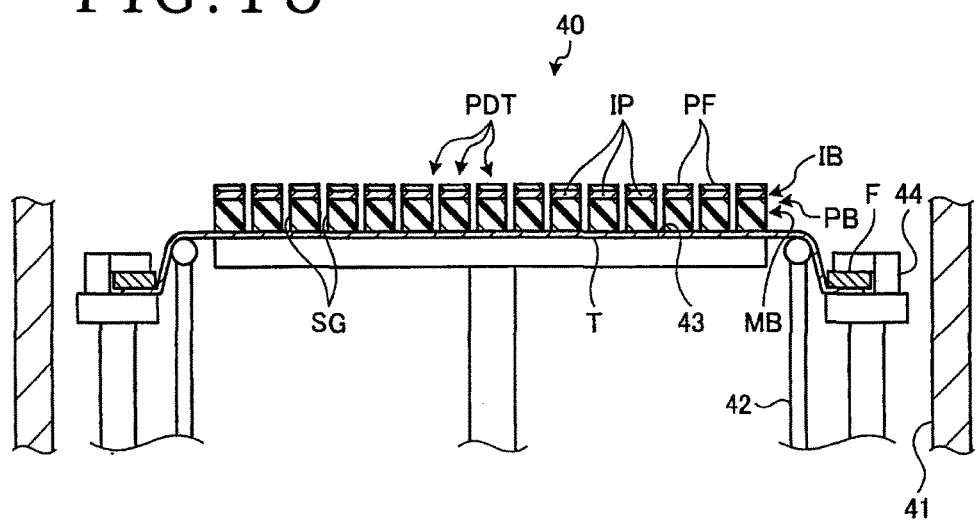
FIG. 15 is a sectional side view depicting a second substep of the interchip distance increasing step, in which the adhesive tape is expanded to increase the distance between any adjacent ones of the package device chips.
Figure 16:
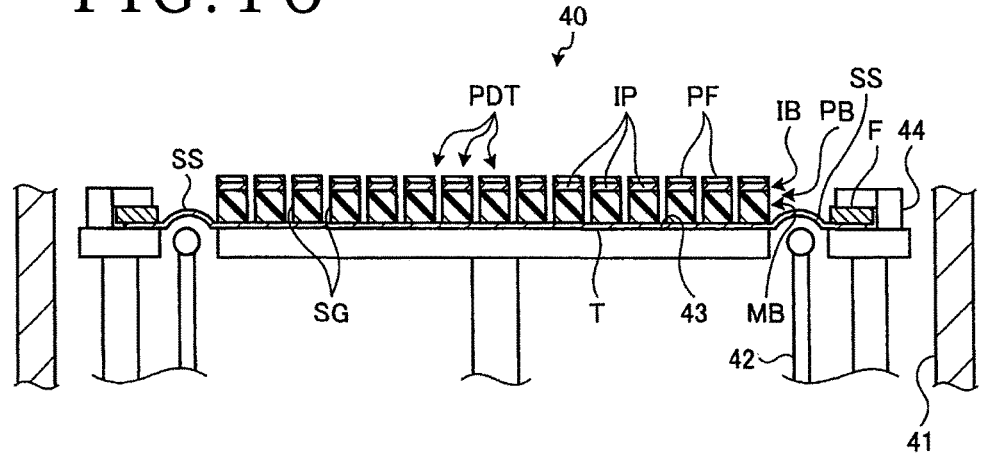
FIG. 16 is a sectional side view depicting a third substep of the interchip distance increasing step, in which the expansion of the adhesive tape is finished to form a slack of the adhesive tape.

FIG. 14 is a sectional side view depicting a first substep of the interchip distance increasing step ST4 in the processing method depicted in FIG. 5, in which the package device chips PDT and the annular frame F are held through the adhesive tape T in the expanding and heating unit 40. FIG. 15 is a sectional side view depicting a second substep of the interchip distance increasing step ST4 in the processing method depicted in FIG. 5, in which the adhesive tape T is expanded to increase the distance between any adjacent ones of the package device chips PDT. FIG. 16 is a sectional side view depicting a third substep of the interchip distance increasing step ST4 in the processing method depicted in FIG. 5, in which the expansion of the adhesive tape T is finished to form a slack SS of the adhesive tape T.

The interchip distance increasing step ST4 is the step of expanding the adhesive tape T after performing the dividing step ST3, thereby increasing the distance between any adjacent ones of the package device chips PDT to a distance greater than or equal to the diameter of the filler FL in the condition where the filler FL is caught between the adjacent package device chips PDT. The interchip distance increasing step ST4 is performed by using the expanding and heating unit 40 depicted in FIG. 14. The expanding and heating unit 40 includes a housing 41, expansion drum 42, chuck table 43, and frame holding portion 44. In the interchip distance increasing step ST4, the resin package substrate PB fixed to the annular frame F is transferred into the housing 41 by the transfer unit (not depicted). At this time, the expansion drum 42 and the chuck table 43 are set at a lower position (standby position) depicted in FIG. 14. Thereafter, the annular frame F is mounted and held through the adhesive tape T by the frame holding portion 44, and the resin package substrate PB is placed through the adhesive tape T on the chuck table 43 as depicted in FIG. 14. The expansion drum 42 is a cylindrical member and it is located inside the frame holding portion 44. The outer diameter of the expansion drum 42 is smaller than the inner diameter of the annular frame F (i.e., the diameter of the inside opening Fa), and the inner diameter of the expansion drum 42 is larger than the outer diameter of the resin package substrate PB. The expansion drum 42 is vertically movable by an air cylinder (not depicted). The chuck table 43 is so configured as to hold the resin package substrate PB through the adhesive tape T under suction by using a vacuum produced by a vacuum source (not depicted). Further, the chuck table 43 is vertically movable by an air cylinder (not depicted).

After holding the resin package substrate PB on the chuck table 43 and holding the annular frame F on the frame holding portion 44, the expansion drum 42 and the chuck table 43 are raised by operating the air cylinders as depicted in FIG. 15, so that the adhesive tape T is pressed upward by the upper end of the expansion drum 42. As a result, an external force (tensile force) is radially applied to the adhesive tape T and the resin package substrate PB attached thereto. The resin package substrate PB has already been divided into the package device chips PDT by the division grooves SG in the previous dividing step ST3. Accordingly, when the tensile force is radially applied to the adhesive tape T, the adhesive tape T is expanded to thereby increase the distance between any adjacent ones of the package device chips PDT as depicted in FIG. 15. In this manner, by relatively moving the annular frame F and the resin package substrate PB attached to the adhesive tape T away from each other in a vertical direction perpendicular to the planar direction of the adhesive tape T (e.g., by moving the resin package substrate PB in an upward direction perpendicular to the planar direction of the adhesive tape T in this preferred embodiment), the distance between any adjacent ones of the package device chips PDT can be increased. The length of expansion of the adhesive tape T by the movement of the expansion drum 42 is set so that the distance between any adjacent ones of the package device chips PDT becomes greater than or equal to the diameter of the filler FL and the base sheet of the adhesive tape T is not broken.

After increasing the distance between any adjacent ones of the package device chips PDT, the expansion drum 42 is lowered in the condition where the resin package substrate PB is held on the chuck table 43 under suction. Since the resin package substrate PB is held on the chuck table 43 under suction, the increased distance between the adjacent package device chips PDT can be maintained. Thereafter, the chuck table 43 is lowered to produce a slack SS of the adhesive tape T between the resin package substrate PB and the annular frame F as depicted in FIG. 16. This slack SS is formed in an annular portion of the adhesive tape T between the resin package substrate PB and the annular frame F after expanding the adhesive tape T, in which the slack SS is present in a plane different from the plane where the resin package substrate PB and the annular frame F are present as depicted in FIG. 16.

(Slack Removing Step ST5)

Figure 17:
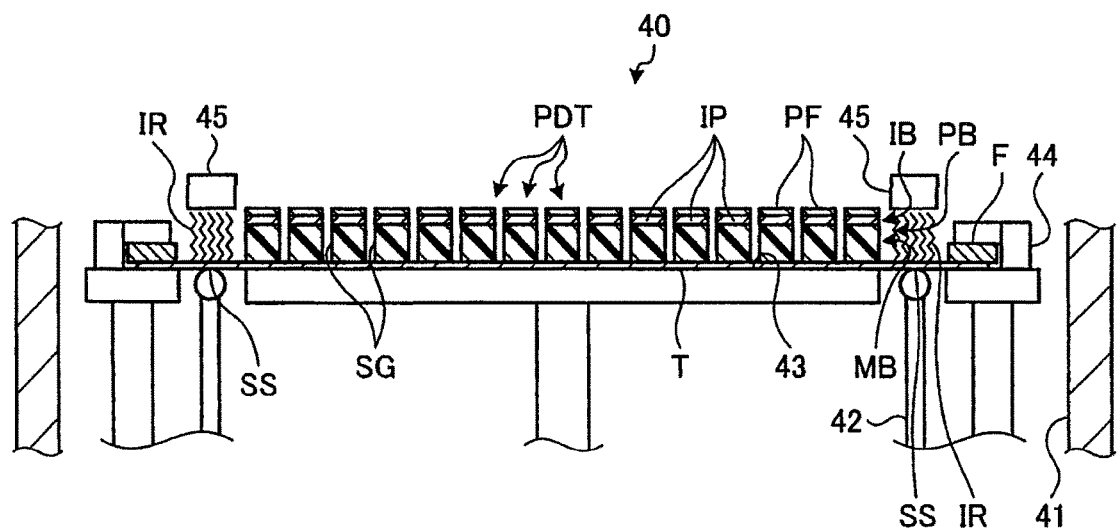
FIG. 17 is a sectional side view depicting a slack removing step in the resin package substrate processing method depicted in FIG. 5, in which the slack is removed by contraction.
Figure 18:
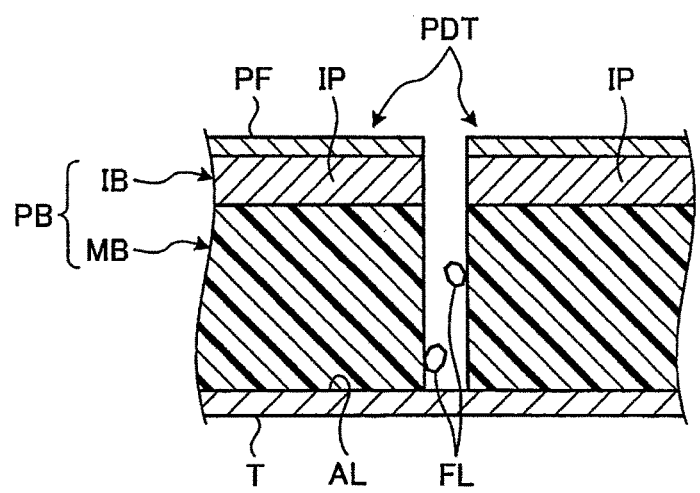
FIG. 18 is an enlarged sectional view of an essential part between the adjacent package device chips depicted in FIG. 17.

FIG. 17 is a sectional side view depicting the slack removing step ST5 in the processing method depicted in FIG. 5, in which the slack SS is removed by contraction. FIG. 18 is an enlarged sectional view of an essential part between the adjacent package device chips PDT depicted in FIG. 17.

The slack removing step ST5 is performed between the interchip distance increasing step ST4 and the cleaning step ST6, and this step ST5 is the step of removing the slack SS of the adhesive tape T due to the expansion of the adhesive tape T.

As depicted in FIG. 17, the slack removing step ST5 is performed by using the expanding and heating unit 40 having a heater 45. The heater 45 is first opposed to the slack SS to heat the slack SS, thereby contracting the slack SS. The heater 45 is an annular member having an outer diameter smaller than the inner diameter of the annular frame F and having an inner diameter larger than the outer diameter of the resin package substrate PB. For example, the heater 45 is an infrared heater for applying infrared light IR to the slack SS to heat the slack SS, thereby contracting the slack SS.

After a predetermined period of time has elapsed, heating of the slack SS by the heater 45 is stopped. Further, suction holding of the resin package substrate PB by the chuck table 43 is canceled, and clamping of the annular frame F by the frame holding portion 44 is also canceled. Thus, the slack SS is removed by contraction in the condition where the increased distance between the adjacent package device chips PDT is maintained. Accordingly, as depicted in FIG. 18, the increased distance between the adjacent package device chips PDT can be maintained, and the filler FL caught between the adjacent device chips PDT is exposed.

(Cleaning Step ST6)

Figure 19:
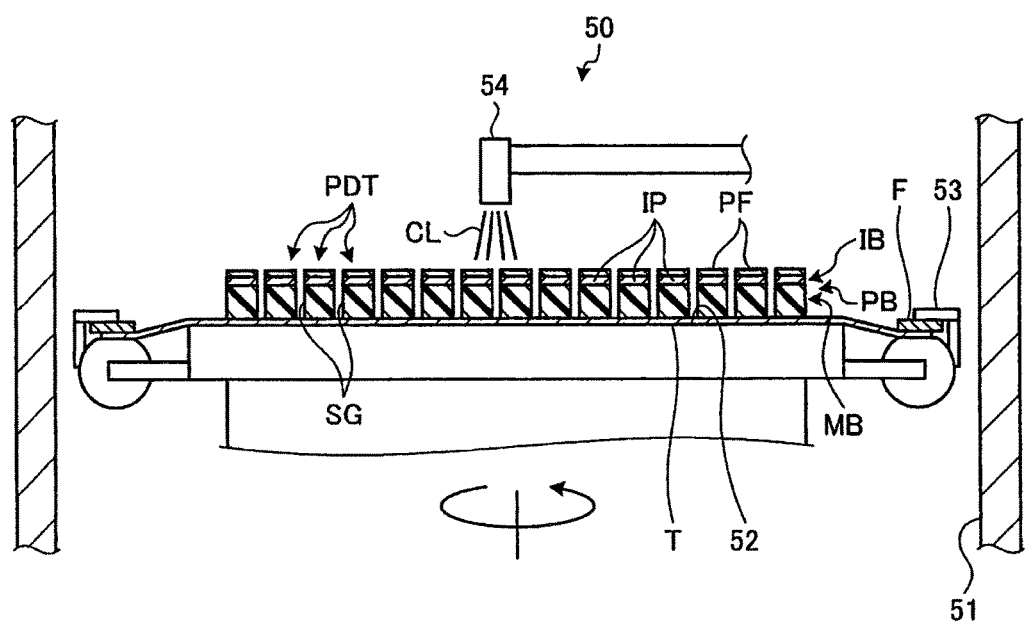
FIG. 19 is a sectional side view depicting a cleaning step in the resin package substrate processing method depicted in FIG. 5.
Figure 20:
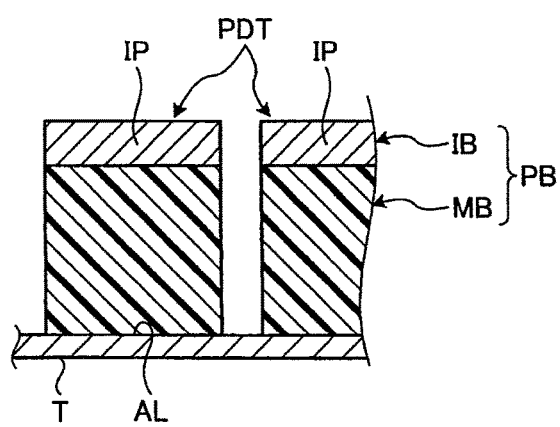
FIG. 20 is an enlarged sectional side view of an essential part between the adjacent package device chips in the condition obtained by the cleaning step.

FIG. 19 is a sectional side view depicting the cleaning step ST6 in the processing method depicted in FIG. 5. FIG. 20 is an enlarged sectional view of an essential part between the adjacent package device chips PDT in the condition obtained by the cleaning step ST6.

The cleaning step ST6 is the step of supplying a cleaning liquid CL (see FIG. 19) to the resin package substrate PB in the condition where the distance between the adjacent package device chips PDT has been increased and thereby removing the filler FL caught between the adjacent package device chips PDT and also removing the protective film PF formed on each package device chip PDT.

The cleaning step ST6 is performed by using the cleaning unit 50 depicted in FIG. 19. The cleaning unit 50 includes a housing 51, chuck table 52, frame holding portion 53, and nozzle 54. In the cleaning step ST6, the resin package substrate PB fixed to the annular frame F is transferred into the housing 51 by the transfer unit (not depicted). Thereafter, the resin package substrate PB is held through the adhesive tape T on the chuck table 52 under suction, and the annular frame F is clamped by the frame holding portion 53. The chuck table 52 is so configured as to hold the resin package substrate PB through the adhesive tape T under suction by using a vacuum produced by a vacuum source (not depicted).

Thereafter, the nozzle 54 is positioned above the center of the resin package substrate PB held on the chuck table 52, and the cleaning liquid CL is discharged from the nozzle 54 to the upper surface of the resin package substrate PB as rotating the chuck table 52 about its axis extending in a vertical direction as depicted in FIG. 19. The nozzle 54 is horizontally swingable above the chuck table 52. Accordingly, in supplying the cleaning liquid CL to the resin package substrate PB held on the chuck table 52, the nozzle 54 is swung in a planar direction parallel to the upper surface of the chuck table 52 as passing through the center of the resin package substrate PB as viewed in plan. As a result, the cleaning liquid CL supplied from the nozzle 54 is allowed to flow toward the outer circumference of the resin package substrate PB by a centrifugal force produced by the rotation of the chuck table 52, thereby removing the filler FL caught between the adjacent package device chips PDT and also removing the protective film PF. Since the protective film PF is formed of a water-soluble liquid resin, the protective film PF is dissolved in the cleaning liquid CL. For example, pure water is used as the cleaning liquid CL in this preferred embodiment. After removing the filler FL and the protective film PF, the supply of the cleaning liquid CL from the nozzle 54 is stopped. Further, suction holding of the resin package substrate PB by the chuck table 52 is canceled, and clamping of the annular frame F by the frame holding portion 53 is also canceled.

(Ultraviolet Light Applying Step ST7)

The ultraviolet light applying step ST7 is the step of applying ultraviolet light to the adhesive layer AL of the adhesive tape T attached to the resin package substrate PB in the condition where the resin package substrate PB has been divided into the individual package device chips PDT and the filler FL has been removed from the space between the adjacent package device chips PDT.

The ultraviolet light applying step ST7 is performed by using the ultraviolet light applying unit (not depicted) having a housing and ultraviolet light applying means. In the ultraviolet light applying step ST7, the resin package substrate PB fixed to the annular frame F is transferred into the housing of the ultraviolet light applying unit by the transfer unit (not depicted), and the ultraviolet light applying means of the ultraviolet light applying unit is operated to apply ultraviolet light from the lower side of the adhesive tape T toward the mold substrate MB for a predetermined period of time, thereby applying the ultraviolet light to the adhesive layer AL to thereby cure the adhesive material forming the adhesive layer AL. That is, by curing the adhesive material forming the adhesive layer AL, the adhesion of the adhesive layer AL can be reduced. Thereafter, the resin package substrate PB fixed to the annular frame F is stored into a cassette (not depicted) by the transfer unit.

(Pickup Step ST8)

Figure 21:
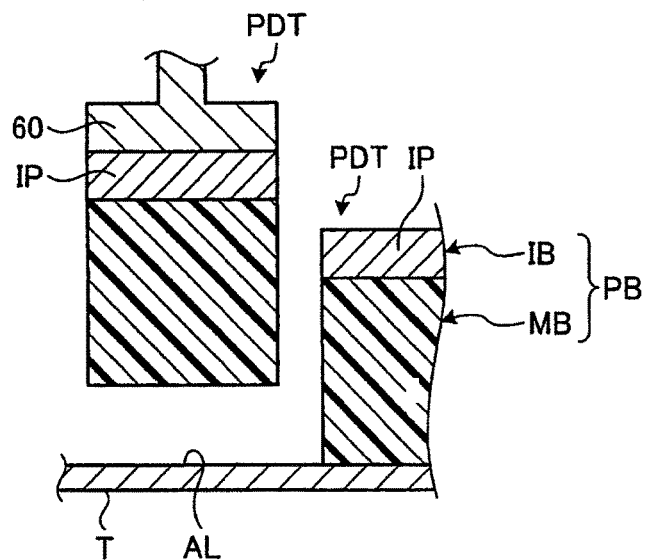
FIG. 21 is an enlarged sectional view depicting a pickup step in the resin package substrate processing method depicted in FIG. 5.

FIG. 21 is an enlarged sectional view depicting the pickup step ST8 in the processing method depicted in FIG. 5.

The pickup step ST8 is the step of picking up each package device chip PDT from the adhesive tape T. The pickup step ST8 is performed by using a pickup unit 60 depicted in FIG. 21. The pickup unit 60 is so configured as to hold each package device chip PDT under suction. As depicted in FIG. 21, the wiring pattern IP of each package device chip PDT is held by the pickup unit 60 under suction, and each package device chip PDT is picked up from the adhesive tape T. Since the filler FL caught between the adjacent package device chips PDT has been removed in the cleaning step ST6, there is no possibility that the filler FL may fall from each package device chip PDT picked up from the adhesive tape T. After finishing this pickup step ST8, the processing method is ended.

In the processing method according to the first preferred embodiment, the division grooves SG are formed by the dividing step ST3 and the width of each division groove SG is increased by the interchip distance increasing step ST4. In this condition, the resin package substrate PB divided into the individual package device chips PDT is cleaned by the cleaning step ST6. Accordingly, the filler FL caught in each division groove SG, i.e., between the adjacent package device chips PDT can be easily removed by the cleaning liquid CL. As a result, the filler FL caught in each division groove SG, i.e., between the adjacent package device chips PDT can be removed to thereby prevent falling of the filler FL in the subsequent step.

In the processing method according to the first preferred embodiment, the slack SS of the adhesive tape T is produced in the interchip distance increasing step ST4 and this slack SS is removed by contraction in the slack removing step ST5. Accordingly, the increased distance between the adjacent package device chips PDT can be maintained even after the slack removing step ST5. As a result, in the cleaning step ST6, the resin package substrate PB can be reliably cleaned in the condition where the increased distance between the adjacent package device chips PDT is maintained, so that the filler FL caught between the adjacent package device chips PDT can be reliably removed in the cleaning step ST6.

In the processing method according to the first preferred embodiment, the protective film PF is formed before performing the dividing step ST3, and the protective film PF is removed together with the filler FL in the cleaning step ST6. Accordingly, debris produced in the dividing step ST3 can be removed together with the protective film PF in the cleaning step ST6, so that deposition of the debris to the wiring patterns IP can be prevented.

In the processing method according to the first preferred embodiment, the dividing step ST3 is composed of the first substep of applying the laser beam LB1 to the interposer substrate IB to form the first division grooves SG1 dividing the interposer substrate IB and the second substep of applying the laser beam LB2 through the first division grooves SG1 to the mold substrate MB to form the second division grooves SG2 dividing the mold substrate MB. Accordingly, the division grooves SG dividing the resin package substrate PB can be reliably formed to obtain the individual package device chips PDT. As a result, the resin package substrate PB can be reliably divided into the individual package device chips PDT.

Second Preferred Embodiment

Figure 22:
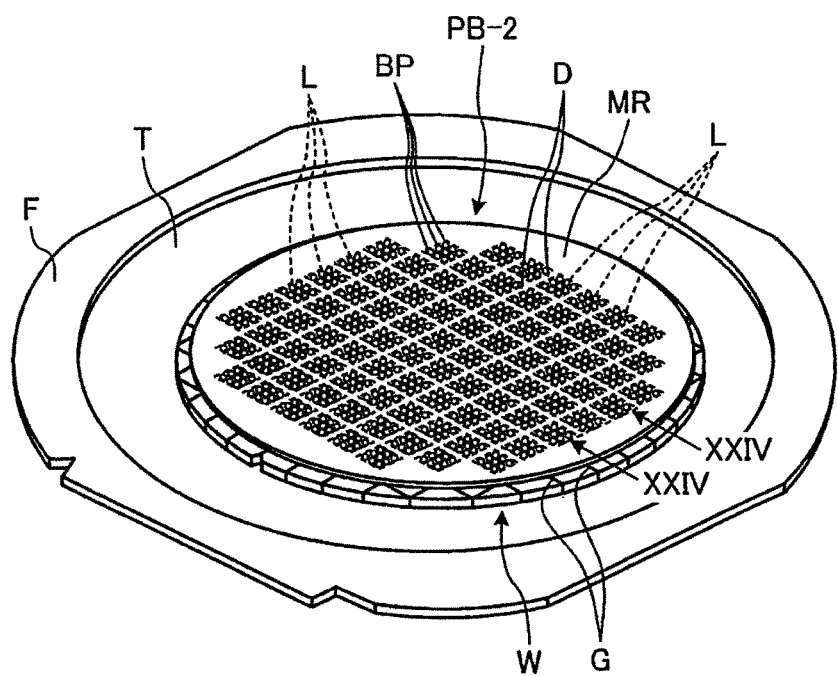
FIG. 22 is a perspective view depicting a resin package substrate fixed through an adhesive tape to an annular frame as obtained by a fixing step in a resin package substrate processing method according to a second preferred embodiment of the present invention.
Figure 23:
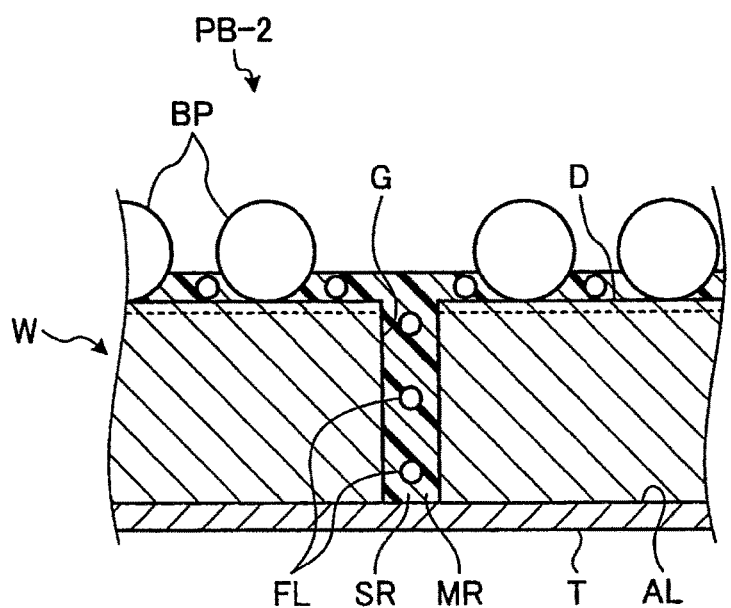
FIG. 23 is an enlarged cross section taken along the line XXIII-XXIII in FIG. 22.
Figure 24:
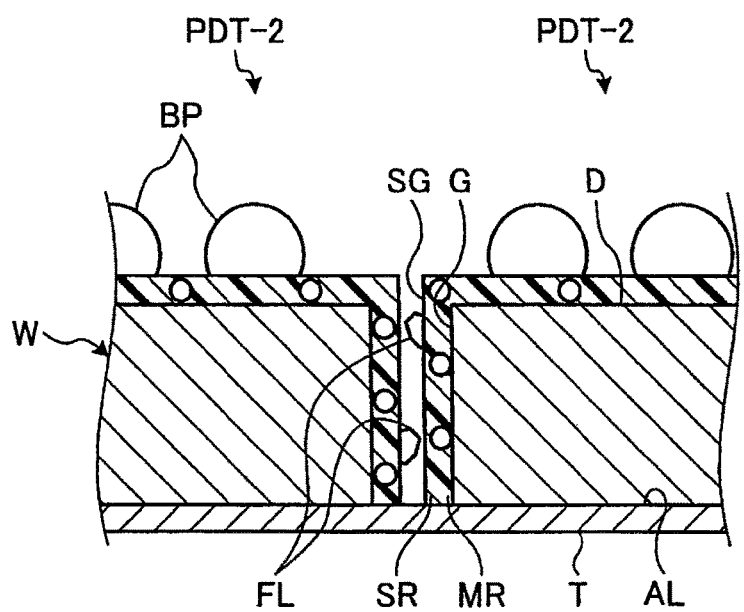
FIG. 24 is an enlarged sectional view of an essential part of the resin package substrate in the condition obtained by a dividing step in the resin package substrate processing method according to the second preferred embodiment.
Figure 25:
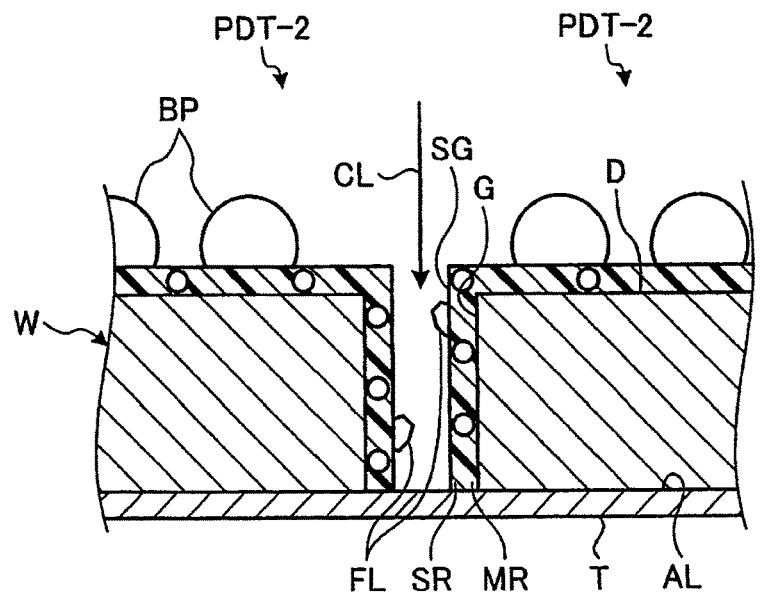
FIG. 25 is an enlarged sectional view of an essential part of the resin package substrate in the condition obtained by an interchip distance increasing step in the resin package substrate processing method according to the second preferred embodiment.
Figure 26:
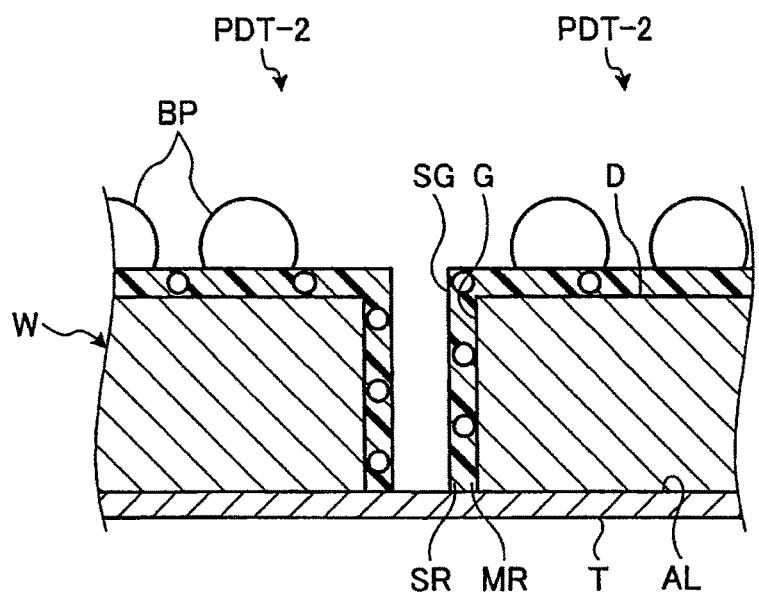
FIG. 26 is an enlarged sectional view of an essential part of the resin package substrate in the condition obtained by a cleaning step in the resin package substrate processing method according to the second preferred embodiment.

A resin package substrate processing method according to a second preferred embodiment will now be described with reference to the drawings. FIG. 22 is a perspective view depicting a resin package substrate PB-2 fixed through an adhesive tape T to an annular frame F as obtained by a fixing step in the resin package substrate processing method according to the second preferred embodiment. FIG. 23 is an enlarged cross section taken along the line XXIII-XXIII in FIG. 22. FIG. 24 is an enlarged sectional view of an essential part of the resin package substrate PB-2 in the condition obtained by a dividing step in the resin package substrate processing method according to the second preferred embodiment. FIG. 25 is an enlarged sectional view of an essential part of the resin package substrate PB-2 in the condition obtained by an interchip distance increasing step in the resin package substrate processing method according to the second preferred embodiment. FIG. 26 is an enlarged sectional view of an essential part of the resin package substrate PB-2 in the condition obtained by a cleaning step in the resin package substrate processing method according to the second preferred embodiment. In FIGS. 22 to 26, the same parts as those in the first preferred embodiment are denoted by the same reference characters, and the description thereof will be omitted herein.

The resin package substrate processing method (which will be hereinafter referred to simply as "processing method") according to the second preferred embodiment is similar to the processing method according to the first preferred embodiment except that the resin package substrate PB-2 as a workpiece depicted in FIG. 22 is different from the resin package substrate PB. As depicted in FIG. 23, the resin package substrate PB-2 includes a disk-shaped wafer W such as a semiconductor wafer and an optical device wafer. The wafer W is formed from a substrate of silicon, sapphire, or gallium arsenide, for example. The front side of the wafer W is partitioned by a plurality of crossing division lines L (e.g., intersecting at right angles in this preferred embodiment) to thereby define a plurality of separate regions where a plurality of devices D are formed.

A plurality of bumps BP as projecting electrodes are formed on the front side of each device D.

The resin package substrate PB-2 is formed with a plurality of grooves G each dividing any adjacent ones of the plural devices D, the plural grooves G each corresponding to the plural division lines L. The upper surface and the side surface of each device D are covered with a mold resin MR. That is, each groove G is filled with the mold resin MR. The mold resin MR is not formed on a peripheral portion of the wafer W over the outer circumference thereof as depicted in FIG. 22, for the purpose of alignment. In the processing method according to the second preferred embodiment, the mold resin MR present in each groove G of the resin package substrate PB-2 is cut to obtain a plurality of package device chips PDT-2 as chips as depicted in FIG. 24. Each package device chip PDT-2 has a configuration such that the upper surface and the side surface of each device D and its substrate are covered with the mold resin MR and that the bumps BP formed on the upper surface of each device D project from the upper surface of the mold resin MR.

As similar to the first preferred embodiment, the processing method according to the second preferred embodiment includes a fixing step ST1, liquid resin applying step ST2, dividing step ST3, interchip distance increasing step ST4, slack removing step ST5, cleaning step ST6, ultraviolet light applying step ST7, and pickup step ST8.

In the dividing step ST3 in the processing method according to the second preferred embodiment, a laser beam LB2 having an absorption wavelength to the mold resin MR is applied to the mold resin MR present in each groove G of the wafer W, thereby forming a division groove SG in the mold resin MR present in each groove G of the wafer W, i.e., along each division line L as depicted in FIG. 24. A filler FL is left in each division groove G as depicted in FIG. 24.

In the interchip distance increasing step ST4 in the processing method according to the second preferred embodiment, the distance between any adjacent ones of the package device chips PDT-2 is increased in a manner similar to that of the first preferred embodiment to obtain the condition depicted in FIG. 25. Thereafter, the cleaning step ST6 is performed to clean the resin package substrate PB-2 by discharging a cleaning liquid CL as depicted in FIG. 25, thereby obtaining the condition depicted in FIG. 26. As depicted in FIG. 26, the filler FL caught between the adjacent package device chips PDT-2 can be removed.

The processing method according to the second preferred embodiment can exhibit an effect similar to that obtained by the first preferred embodiment. That is, the width of each division groove SG formed by the dividing step ST3 is increased by the interchip distance increasing step ST4, and the cleaning step ST6 is performed in the condition where the increased distance between the adjacent package device chips PDT-2 is maintained. Accordingly, the filler FL caught in each division groove SG, i.e., between the adjacent package device chips PDT-2 can be easily removed by the cleaning step ST6, so that falling of the filler FL can be prevented in the subsequent step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A resin package substrate processing method for processing a resin package substrate including a mold resin in which a filler having a plurality of filler particles is mixed, said resin package substrate processing method comprising:

a fixing step of fixing said resin package substrate through an expandable adhesive tape to an annular frame having an inside opening in the condition where said resin package substrate is positioned in said inside opening of said annular frame;

a dividing step of applying a laser beam having an absorption wavelength to said mold resin of said resin package substrate, to said mold resin after performing said fixing step, thereby forming a plurality of division grooves and dividing said resin package substrate into a plurality of chips;

an interchip distance increasing step of expanding said adhesive tape after performing said dividing step, thereby increasing the distance between any adjacent ones of said chips to a distance greater than or equal to a maximum diameter of said filler particles caught between said adjacent chips; and a cleaning step of supplying a cleaning liquid to said resin package substrate after performing said interchip distance increasing step, thereby removing said filler particles caught between said adjacent chips, whereby when each chip is picked up from said adhesive tape, falling of said filler particles from each chip is prevented.

2. The resin package substrate processing method according to claim 1, wherein said interchip distance increasing step includes a step of relatively moving said annular frame and said resin package substrate attached to said adhesive tape away from each other in a direction perpendicular to a planar direction of said adhesive tape, thereby increasing the distance between said adjacent chips, said resin package substrate processing method further comprising a slack removing step of removing a slack of said adhesive tape due to expansion of said adhesive tape, between said interchip distance increasing step and said cleaning step, by directing heat at the slack of said adhesive tape.

3. The resin package substrate processing method according to claim 1, wherein said resin package substrate includes a mold substrate and an interposer substrate stacked on said mold substrate, said mold substrate having a plurality of device chips covered with said mold resin, said resin package substrate processing method further comprising a liquid resin applying step of applying a water-soluble liquid resin to the exposed upper surface of said interposer substrate stacked on said mold substrate, before performing said dividing step, said dividing step including a step of applying a first laser beam having an absorption wavelength to said interposer substrate, to an upper surface of said interposer substrate to thereby form a plurality of first division grooves dividing said interposer substrate, and next applying a second laser beam having an absorption wavelength to said mold resin of said mold substrate, through said first division grooves to said mold resin to thereby form a plurality of second division grooves dividing said mold resin of said mold substrate so that said second division grooves are continuous to said first division grooves, said cleaning step including a step of removing said liquid resin from said interposer substrate.

4. The resin package substrate processing method according to claim 3, said cleaning step further comprising rotating said resin package substrate for generating a centrifugal force to remove said filler particles caught between said adjacent chips.

5. The resin package substrate processing method according to claim 1, further comprising an ultraviolet light applying step including applying ultraviolet light to an adhesive layer of said adhesive tape.

6. The resin package substrate processing method according to claim 1, further comprising a picking step including a step of picking up each of said plurality of chips from said adhesive tape.

7. The resin package substrate processing method according to claim 1, wherein said interchip distance increasing step of expanding said adhesive tape further comprises a step of applying a tensile force to opposing ends of said adhesive tape to increase the distance between said adjacent chips.

8. The resin package substrate processing method according to claim 7, wherein applying said tensile force to opposing ends of said adhesive tape includes moving said resin package substrate and said annular frame away from each other in a vertical direction perpendicular to a planar direction of said adhesive tape.

9. A resin package substrate processing method for processing a resin package substrate including a mold resin in which a filler having a plurality of filler particles is mixed, said resin package substrate processing method comprising:
  a fixing step of fixing said resin package substrate through an expandable adhesive tape to an annular frame having an inside opening in the condition where said resin package substrate is positioned in said inside opening of said annular frame;
  a dividing step of applying a laser beam having an absorption wavelength to said mold resin of said resin package substrate, to said mold resin after performing said fixing step, thereby forming a plurality of division grooves and dividing said resin package substrate into a plurality of chips;
  said dividing step including a step of applying a first laser beam having an absorption wavelength to said interposer substrate, to an upper surface of said interposer substrate to thereby form a plurality of first division grooves dividing said interposer substrate, and next applying a second laser beam having an absorption wavelength to said mold resin of said mold substrate, through said first division grooves to said mold resin to thereby form a plurality of second division grooves dividing said mold resin of said mold substrate so that said second division grooves are continuous to said first division grooves,
  an interchip distance increasing step of expanding said adhesive tape after performing said dividing step, thereby increasing the distance between any adjacent ones of said chips to a distance greater than or equal to a maximum diameter of said filler particles caught between said adjacent chips; and
  a cleaning step of supplying a cleaning liquid to said resin package substrate after performing said interchip distance increasing step, thereby removing said filler particles between said adjacent chips,
  whereby when each chip is picked up from said adhesive tape, falling of said filler particles from each chip is prevented.

10. The resin package substrate processing method according to claim 9, wherein said cleaning step further comprising rotating said resin package substrate for generating a centrifugal force to remove said filler particles caught between said adjacent chips.

11. The resin package substrate processing method according to claim 9, further comprising an ultraviolet light applying step including applying ultraviolet light to an adhesive layer of said adhesive tape.

12. The resin package substrate processing method according to claim 9, further comprising a picking step including a step of picking up each of said plurality of chips from said adhesive tape.

13. The resin package substrate processing method according to claim 9, wherein said interchip distance increasing step of expanding said adhesive tape further comprises a step of applying a tensile force to opposing ends of said adhesive tape to increase the distance between said adjacent chips.

14. The resin package substrate processing method according to claim 13, wherein applying said tensile force to opposing ends of said adhesive tape includes moving said resin package substrate and said annular frame away from each other in a vertical direction perpendicular to a planar direction of said adhesive tape.

* * * * *